United States Patent
Tamura et al.

(10) Patent No.: US 10,253,210 B2
(45) Date of Patent: Apr. 9, 2019

(54) FILM-FORMING COMPOSITION INCLUDING THERMOSETTING RESIN

(71) Applicant: NISSAN CHEMICAL INDUSTRIES, LTD., Tokyo (JP)

(72) Inventors: Mamoru Tamura, Toyama (JP); Makoto Nakajima, Toyama (JP); Tomoyuki Enomoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 113 days.

(21) Appl. No.: 15/512,220

(22) PCT Filed: Sep. 1, 2015

(86) PCT No.: PCT/JP2015/074874
§ 371 (c)(1),
(2) Date: Mar. 17, 2017

(87) PCT Pub. No.: WO2016/043045
PCT Pub. Date: Mar. 24, 2016

(65) Prior Publication Data
US 2017/0253764 A1 Sep. 7, 2017

(30) Foreign Application Priority Data
Sep. 17, 2014 (JP) .................. 2014-188495

(51) Int. Cl.
| | | |
|---|---|---|
| *C09D 175/08* | (2006.01) | |
| *C09D 183/06* | (2006.01) | |
| *H05K 3/28* | (2006.01) | |
| *C08G 18/48* | (2006.01) | |
| *C08G 18/50* | (2006.01) | |
| *C08G 18/80* | (2006.01) | |

(52) U.S. Cl.
CPC ............ *C09D 175/08* (2013.01); *C08G 18/4879* (2013.01); *C08G 18/4887* (2013.01); *C08G 18/5015* (2013.01); *C08G 18/5051* (2013.01); *C08G 18/8077* (2013.01); *C09D 183/06* (2013.01); *H05K 3/285* (2013.01)

(58) Field of Classification Search
CPC ............... C09D 175/08; C09D 183/06; C08G 18/4879; C08G 18/4887
See application file for complete search history.

(56) References Cited

U.S. PATENT DOCUMENTS

| | | | |
|---|---|---|---|
| 3,650,994 A | 3/1972 | Booth | |
| 2014/0228488 A1* | 8/2014 | Tamura | C09D 11/10 524/111 |

FOREIGN PATENT DOCUMENTS

| | | |
|---|---|---|
| JP | S48-85692 A | 11/1973 |
| JP | S51-002091 B2 | 1/1976 |
| JP | S62-123453 A | 6/1987 |
| JP | H01-256512 A | 10/1989 |
| JP | H04-178413 A | 6/1992 |
| JP | H05-098148 A | 4/1993 |
| JP | 2000-003032 A | 1/2000 |
| JP | 2011-75987 A | 4/2011 |
| WO | 2013/118871 A1 | 8/2013 |

OTHER PUBLICATIONS

Dec. 8, 2015 Written Opinion issued with International Patent Application No. PCT/JP2015/074874.
Dec. 8, 2015 International Search Report issued with International Patent Application No. PCT/JP2015/074874.

* cited by examiner

*Primary Examiner* — Hannah J Pak
(74) *Attorney, Agent, or Firm* — Oliff PLC

(57) ABSTRACT

There is provided a film-forming composition for forming a film that covers a substrate and exhibits good electrical insulation properties, heat resistance, and solvent resistance after heating at a low temperature. A film-forming composition including a polymer (A) containing a unit structure of Formula (1):

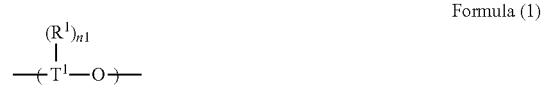

Formula (1)

(wherein $T^1$ is an arylene group or a combination of an arylene group with $T^0$, $T^0$ is an alkylene group, a fluorinated alkylene group, a carbonyl group, a sulfonyl group, or a combination thereof, $R^1$ is a carboxyl group, an amino group, or an imino group, and n1 is an integer of 1 to 6), and a compound (B) having at least two isocyanate groups or blocked isocyanate groups. The polymer (A) is a polymer containing a unit structure of Formula (1) or a structure (A-1) having a combination of the unit structure of Formula (1) with a unit structure of Formula (2):

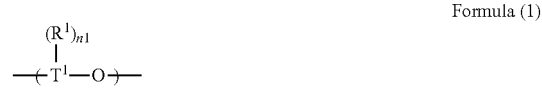

Formula (1)

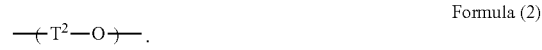

Formula (2)

12 Claims, No Drawings

FILM-FORMING COMPOSITION INCLUDING THERMOSETTING RESIN

TECHNICAL FIELD

The present invention relates to a film-forming composition using a thermosetting resin. In particular, the present invention relates to an insulating film that is formed on a back surface of a wafer processed by a through silicon via (TSV) technology or the like at a process of forming a laminated body in a semiconductor product such as an IC chip, and an optical product.

BACKGROUND ART

In recent years, higher integration of a semiconductor device, a decrease in a mounting area, and a decrease in wiring resistance due to a decrease in the distance between wirings have been required with higher performance and miniaturization of an electronic appliance such as a cell phone and an IC card. As a procedure for the requirement, a laminated structure in which semiconductor elements are stacked longitudinally has been investigated.

An example of a method for producing a stack structure includes the following process. In the process, a wafer with a semiconductor element is bonded to a supporting substrate using a temporary adhesive or the like, a back surface of the wafer is made thin, a through hole is formed by a through silicon via (TSV) technology using a technique such as anisotropic dry etching, the through hole is filled with a conductive material such as copper to form an electrode on the back surface, an insulating film is formed on the back surface of the wafer with the electrode, and a chip or a wafer with another semiconductor element is electrically bonded to the insulating film.

In the process, the insulating film formed on the back surface of the wafer is required to have properties such as electrical insulation properties of preventing current leakage between electrodes, migration of a conductive material, and the like, solvent resistance at a photolithography step after forming an insulating film, and heat resistance at an electrode bonding step, and to express the properties at lower baking temperature from the viewpoint of heat resistance of a member.

Examples of a publicly known insulating film include insulating films formed by spin coating such as a polyimide, a polybenzoxazole, and an aromatic polyether. However, a polyimide and a polybenzoxazole have problems in which good insulating properties and solvent resistance are not obtained at a baking temperature of about 180° C., and a reaction of an unreacted moiety is further promoted at a heating step after formation, to shrink the insulating film.

An aromatic polyether has problems in which the solvent resistance is low due to the absence of thermal cross-linking moiety and a resin is molten by electrode bonding due to the low softening point of the resin.

A passivation film containing a polymer, such as a polyether and a polyetherether ketone, having an organic group including a double bond and a triple bond at a terminal or a side chain of the polymer has been disclosed (see Patent Document 1). However, an aromatic polyether described in Patent Document 1 does not have sufficient properties at 180° C. Further, there is a problem in which electrical insulation properties are deteriorated at a high temperature process.

A resin composition containing a polyether compound and a benzoxazine compound using a crosslinker has been disclosed (see Patent Document 2). As the crosslinker, an isocyanate has been disclosed.

PRIOR ART DOCUMENTS

Patent Documents

Patent Document 1: International publication WO2013/118871

Patent Document 2: Japanese Patent Application Publication No. 2011-75987 (JP 2011-75987 A)

SUMMARY OF THE INVENTION

Problem to be Solved by the Invention

The present invention provides a film-forming composition for forming a film that covers a substrate and exhibits good electrical insulation properties, heat resistance, and solvent resistance after heating at a relatively low temperature (e.g., about 180° C.).

Means for Solving the Problems

A first aspect of the present invention is a film-forming composition including a polymer (A) containing a unit structure of Formula (1):

Formula (1)

(wherein $T^1$ is an arylene group or a combination of an arylene group with $T^0$, $T^0$ is an alkylene group, a fluorinated alkylene group, a carbonyl group, a sulfonyl group, or a combination thereof, $R^1$ is a carboxyl group, an amino group, or an imino group, and n1 is an integer of 1 to 6), and a compound (B) having at least two isocyanate groups or blocked isocyanate groups.

A second aspect is the film-forming composition according to the first aspect, wherein the polymer (A) is a polymer containing a unit structure of Formula (1) or a structure (A-1) having a combination of the unit structure of Formula (1) with a unit structure of Formula (2):

Formula (1)

Formula (2)

(in Formula (1), $T^1$, $R^1$, and n1 have the same meanings as those in the first aspect, and in Formula (2), $T^2$ is an arylene group or a combination of an arylene group with $T^0$, and $T^0$ is an alkylene group, a fluorinated alkylene group, a carbonyl group, a sulfonyl group, or a combination thereof).

A third aspect is the film-forming composition according to the first or second aspect, wherein the polymer (A) is a copolymer containing the structure (A-1) described in the second aspect and a structure (A-2), and the structure (A-2) is a unit structure of Formula (3) or a combination of the unit structure of Formula (3) with a unit structure of Formula (4):

Formula (3)

Formula (4)

(in Formulae (3) and (4), $T^3$ and $T^4$ are each an arylene group or a combination of an arylene group with $T^0$, and $T^0$ is an alkylene group, a fluorinated alkylene group, a carbonyl group, a sulfonyl group, or a combination thereof).

A fourth aspect is the film-forming composition according to any one of the first to third aspects, wherein $T^1$, $T^2$, $T^3$, and $T^4$ in Formulae (1) to (4) are each an organic group selected from the group consisting of the following Formulae (t-1) to (t-7):

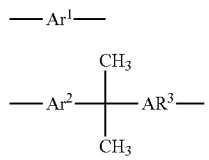

Formula (t-1)

Formula (t-2)

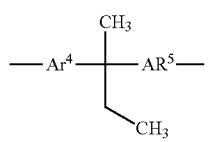

Formula (t-3)

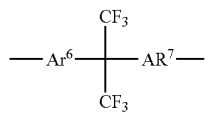

Formula (t-4)

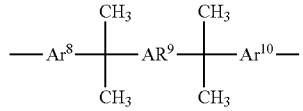

Formula (t-5)

Formula (t-6)

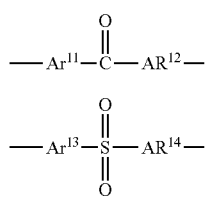

Formula (t-7)

(in Formulae (t-1) to (t-7), $Ar^1$ to $Ar^{14}$ are each a benzene ring, a naphthalene ring, or a fluorene ring).

A fifth aspect is the film-forming composition according to the third or fourth aspect, wherein the polymer (A) contains the structures (A-1) and (A-2) at a ratio by mole of the structure (A-1) to the structure (A-2) of 10:90 to 40:60.

A sixth aspect is the film-forming composition according to any one of the first to fifth aspects, wherein the polymer (A) has a weight average molecular weight of 500 to 5,000,000.

A seventh aspect is the film-forming composition according to any one of the first to sixth aspects, wherein the isocyanate groups or the blocked isocyanate groups in the compound (B) having at least two isocyanate groups or blocked isocyanate groups are contained at a ratio of 0.5 mol to 1.5 mol relative to 1 mol of the carboxyl group, the amino group, or the imino group in the polymer (A).

An eighth aspect is the film-forming composition according to any one of the first to seventh aspects, further comprising a solvent.

A ninth aspect is an insulating film formed from a cured film of the film-forming composition according to any one of the first to eighth aspects.

A tenth aspect is a method for producing an insulating film comprising steps of applying an adhesion enhancing film-forming composition containing a polysiloxane to a substrate and curing the composition to form an adhesion enhancing film, and applying the film-forming composition according to any one of the first to eighth aspects to the film and curing the composition.

An eleventh aspect is the insulating film according to the ninth or tenth aspect that is used as a film of covering a polished face of a thinned wafer.

A twelfth aspect is the insulating film according to the ninth or tenth aspect that is used as a film of protecting a circuit face of a thinned wafer on which a circuit is formed.

Effects of the Invention

According to the present invention, an insulating film capable of achieving good electrical insulation properties, heat resistance, and solvent resistance even after heating at a relatively low temperature (e.g., about 180° C.) can be formed from a polymer having an aromatic polyether structure and a compound having at least two isocyanate groups or blocked isocyanate groups, as described above.

MODES FOR CARRYING OUT THE INVENTION

The present invention is a film-forming composition including a polymer (A) containing a unit structure of Formula (1) described above and a compound (B) having at least two isocyanate groups or blocked isocyanate groups.

The solid content of the film-forming composition of the present invention is 0.1 to 80% by mass, and preferably 1 to 60% by mass. The solid content is a ratio of the film-forming composition except for a solvent. The ratio of the polymer (A) in the solid content may be 30 to 99.9% by mass, 50 to 99.9% by mass, or 50 to 90% by mass.

The isocyanate groups or the blocked isocyanate groups in the compound (B) having at least two isocyanate groups or blocked isocyanate groups are contained at a ratio of 0.5 mol to 1.5 mol relative to 1 mol of the carboxyl group, the amino group, or the imino group in the polymer (A). The compound (B) can be contained at a ratio of 0.05 to 50 parts by mass or 0.1 to 50 parts by mass relative to 1 part by mass of the polymer (A).

In Formula (1), $T^1$ is an arylene group or a combination of an arylene group with $T^0$, and $T^0$ is an alkylene group, a fluorinated alkylene group, a carbonyl group, a sulfonyl group, or a combination thereof. $R^1$ is a carboxyl group, an amino group, or an imino group. n1 is an integer of 1 to 4, 1 to 5, or 1 to 6.

The arylene group is a divalent aromatic ring or an aromatic condensed ring. Examples thereof include phenylene group derived from benzene, naphthylene group derived from naphthalene, fluorene group derived from fluorene, and anthrylene group derived from anthracene. As the arylene group, an arylene group containing a heterocycle containing nitrogen, sulfur, or oxygen can be used.

The alkylene group is a $C_{1-40}$ or $C_{1-10}$ alkylene group. Examples thereof include methylene group, ethylene group, propylene group, butylene group, propane-2,2-diyl group, and butane-2,2-diyl group.

A cyclic alkylene group is a $C_{3-30}$ cyclic alkylene group. Examples thereof include cyclopropylene group, cyclobutylene group, cyclohexylene group, 1-methyl-cyclopentylene group, 2-methyl-cyclopentylene group, 3-methyl-cyclopentylene group, 1-ethyl-cyclobutylene group, 2-ethylcyclobutylene group, 3-ethyl-cyclobutylene group, 1,2-dimethyl-cyclobutylene group, 1,3-dimethyl-cyclobutylene group, 2,2-dimethyl-cyclobutylene group, 2,3-dimethyl-cyclobutylene group, 2,4-dimethyl-cyclobutylene group, 3,3-dimethyl-cyclobutylene group, 1-n-propyl-cyclopropylene group, 2-n-propyl-cyclopropylene group, 1-i-propyl-cyclopropylene group, 2-i-propyl-cyclopropylene group, 1,2,2-trimethyl-cyclopropylene group, 1,2,3-trimethyl-cyclopropylene group, 2,2,3-trimethyl-cyclopropylene group, 1-ethyl-2-methyl-cyclopropylene group, 2-ethyl-1-methyl-cyclopropylene group, 2-ethyl-2-methyl-cyclopropylene group, and 2-ethyl-3-methyl-cyclopropylene group. Further, a divalent organic group derived from adamantane or norbornene can be used.

The fluorinated alkylene group is an organic group in which a part or all of hydrogen atoms of the alkylene group is substituted by a fluorine atom. Examples thereof include difluoromethylene group, hexafluoropropane-2,2-diyl group, and octafluorobutane-2,2-diyl group.

$T^1$ is an arylene group or an alkylene group in which a part of hydrogen atoms is substituted by a carboxyl group, an amino group, or an imino group. The ratio of the carboxyl group, the amino group, or the imino group in $T^1$ is 1 to 4, 1 to 5, or 1 to 6. The carboxyl group, the amino group, or the imino group can be reacted with the isocyanate groups or the blocked isocyanate groups in the compound (B) having isocyanate groups or blocked isocyanate groups to form a cross-linking structure.

The polymer (A) may be a polymer containing the unit structure of Formula (1) or a structure (A-1) having a combination of the unit structure of Formula (1) with a unit structure of Formula (2) described above. In Formula (2), $T^2$ is an arylene group or a combination of an arylene group with $T^0$, and $T^0$ is an alkylene group, a fluorinated alkylene group, a carbonyl group, a sulfonyl group, or a combination thereof. Examples of the arylene group and the alkylene group and fluorinated alkylene group of $T^0$ are examples described above.

The polymer (A) is a copolymer containing the structure (A-1) and a structure (A-2). The structure (A-2) may contain a unit structure of Formula (3) described above or a combination of the unit structure of Formula (3) with a unit structure of Formula (4) described above. In Formulae (3) and (4), $T^3$ and $T^4$ are each an arylene group or a combination of an arylene group with $T^0$, and $T^0$ is an alkylene group, a fluorinated alkylene group, a carbonyl group, a sulfonyl group, or a combination thereof. Examples of the arylene group and the alkylene group and the fluorinated alkylene group of $T^0$ are examples described above.

In Formulae (1) to (4), $T^1$, $T^2$, $T^3$, and $T^4$ are each an organic group selected from the group consisting of Formulae (t-1) to (t-7) described above. In Formulae (t-1) to (t-7), $Ar^1$ to $Ar^{14}$ are each a benzene ring, a naphthalene ring, or a fluorene ring.

The polymer (A) contains the structures (A-1) and (A-2) at a ratio by mole of the structure (A-1) to the structure (A-2) of 10:90 to 40:60.

The weight average molecular weight of the polymer (A) may fall within a range of 500 to 5,000,000 or 5,000 to 100,000.

$T^1$, $T^2$, $T^3$, and $T^4$ may each have any substituent. Examples of the substituent include hydroxyl group, allyl group, allyloxy group, amino group, cyano group, nitro group, acyl group, acyloxy group, and carboxyl group.

Examples of the unit structure in the polymer used in the present invention include as follows. Examples of the structure (A-1) are represented by (A-1-1) to (A-1-28). Examples of the structure (A-2) are represented by (A-2-1) to (A-2-15).

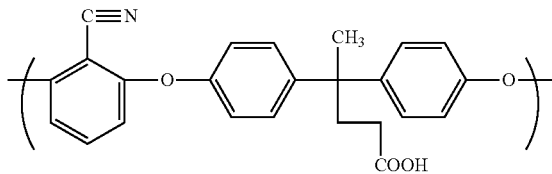

Formula (A-1-1)

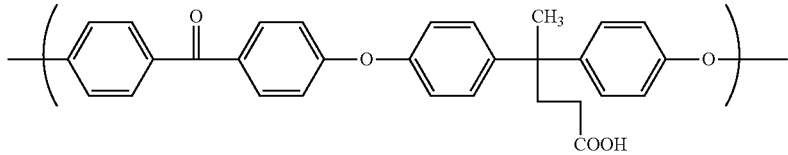

Formula (A-1-2)

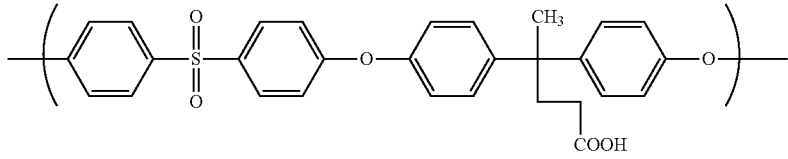

Formula (A-1-3)

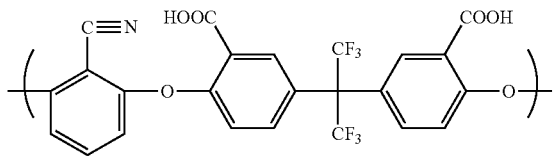

Formula (A-1-4)

-continued
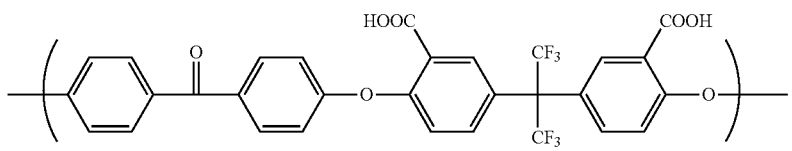
Formula (A-1-5)
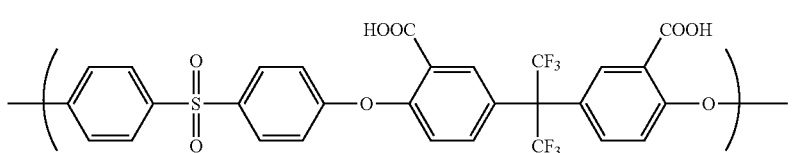
Formula (A-1-6)
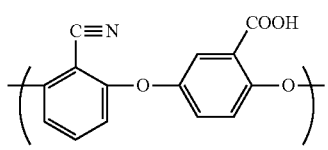
Formula (A-1-7)
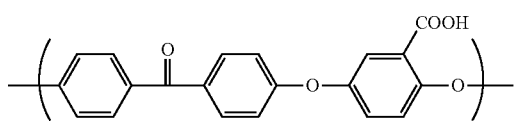
Formula (A-1-8)
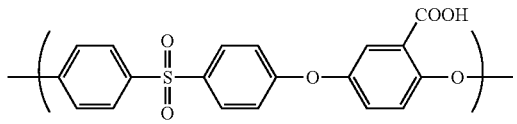
Formula (A-1-9)
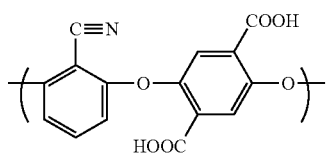
Formula (A-1-10)
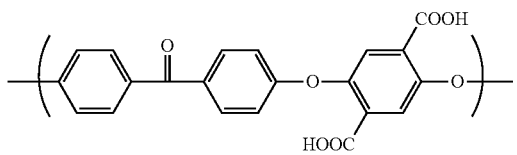
Formula (A-1-11)
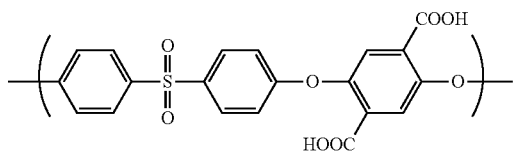
Formula (A-1-12)
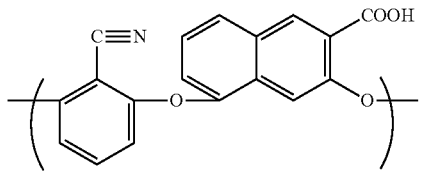
Formula (A-1-13)
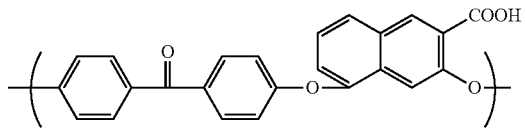
Formula (A-1-14)
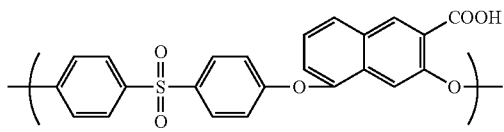
Formula (A-1-15)
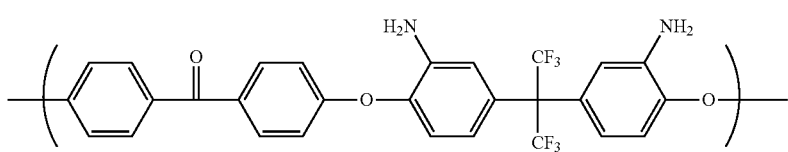
Formula (A-1-16)
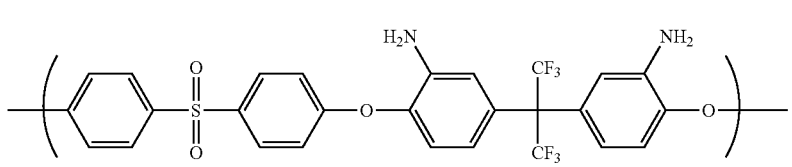
Formula (A-1-17)
Formula (A-1-18)

-continued
Formula (A-1-19)
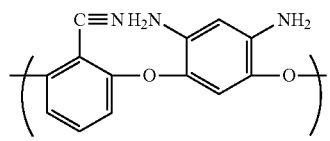
Formula (A-1-20)
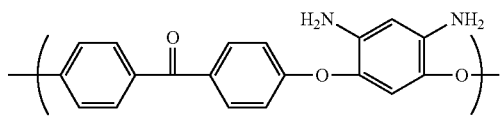
Formula (A-1-21)
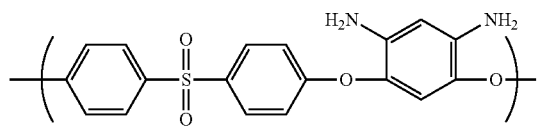
Formula (A-1-22)
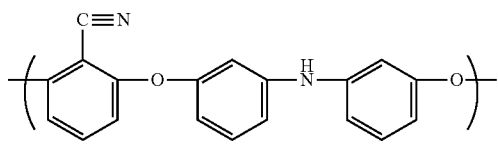
Formula (A-1-23)
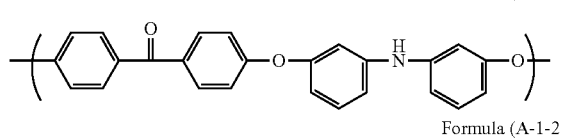
Formula (A-1-24)
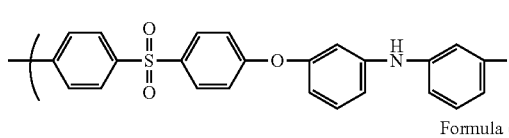
Formula (A-1-25)
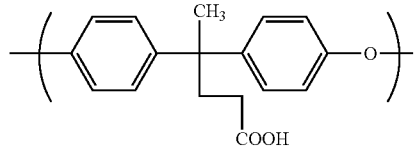
Formula (A-1-26)
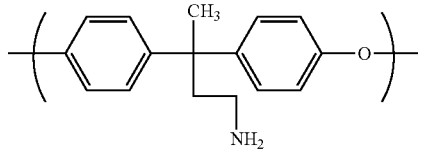
Formula (A-1-27)
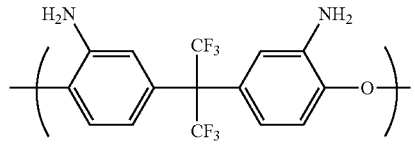
Formula (A-1-28)
Formula (A-2-1)
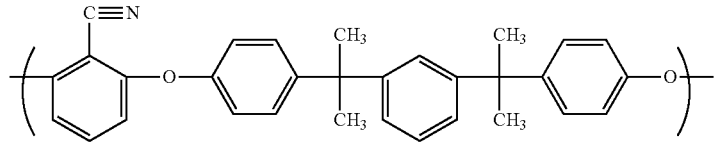
Formula (A-2-2)
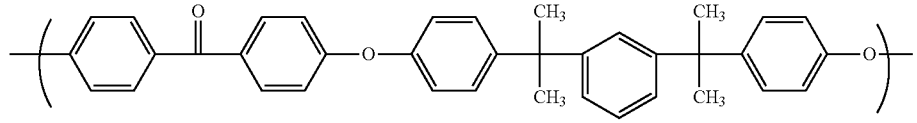
Formula (A-2-3)
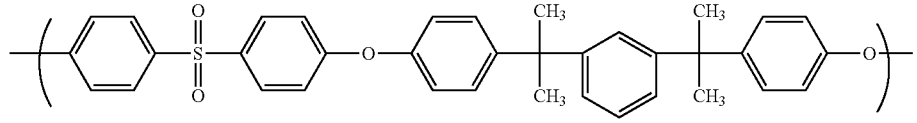
Formula (A-2-4)
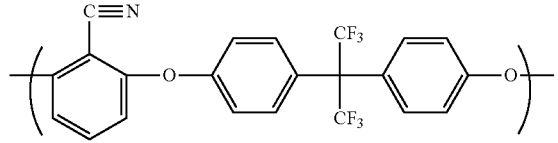
Formula (A-2-5)
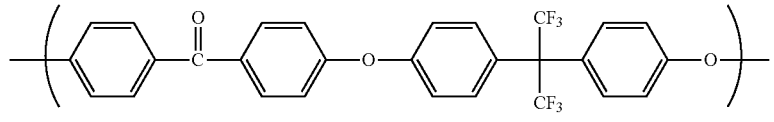
Formula (A-2-6)
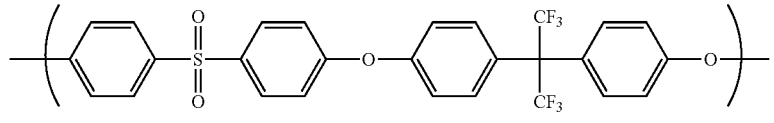

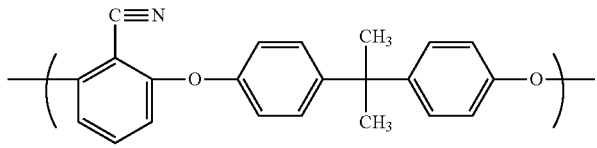

Formula (A-2-7)

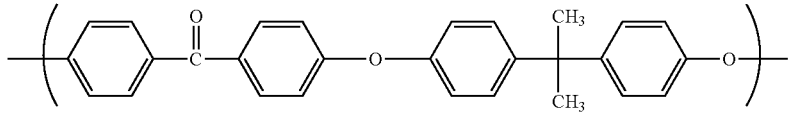

Formula (A-2-8)

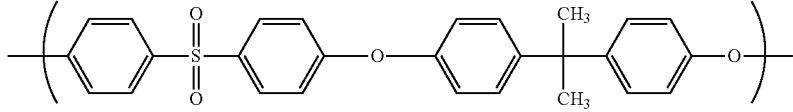

Formula (A-2-9)

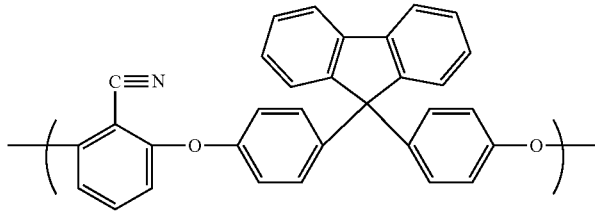

Formula (A-2-10)

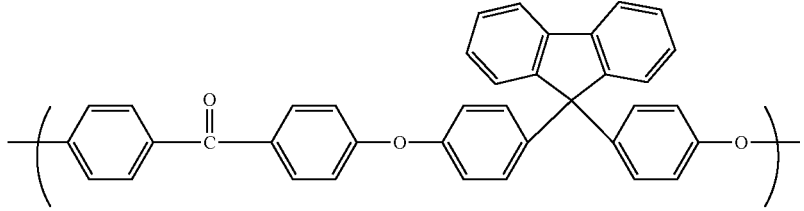

Formula (A-2-11)

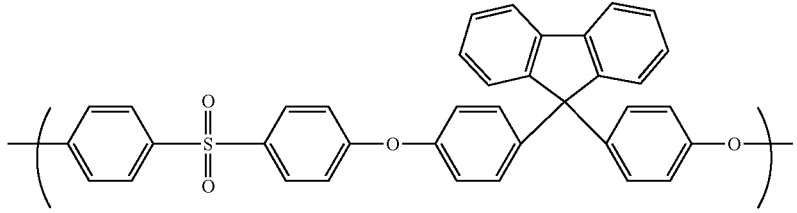

Formula (A-2-12)

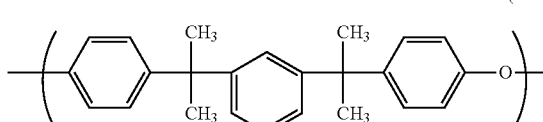

Formula (A-2-13)

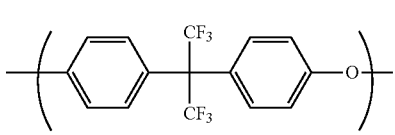

Formula (A-2-14)

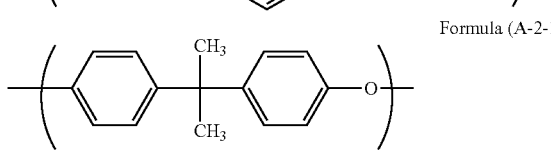

Formula (A-2-15)

Examples of the polymer used in the present invention include a polymer (A11) having structures of Formulae (A-1-1) and (A-2-4) at a ratio by mole of 30:70, a polymer (A12) having structures of Formulae (A-1-2) and (A-2-4) at a ratio by mole of 30:70, a polymer (A13) having structures of Formulae (A-1-17) and (A-2-4) at a ratio by mole of 20:80, a polymer (A14) having structures of Formulae (A-1-17), (A-2-2), and (A-2-4) at a ratio by mole of 30:50:20, a polymer (A15) having structures of Formulae (A-1-17), (A-2-11), and (A-2-4) at a ratio by mole of 20:50:30, and a polymer (A16) having structures of Formulae (A-1-17), (A-2-2), and (A-2-4) at a ratio by mole of 20:50:30.

The compound (B) having at least two isocyanate groups or blocked isocyanate groups used in the present invention acts as a crosslinker, and can be reacted with the carboxyl group, the amino group, or the imino group in the polymer (A) to form a cross-linking structure.

The compound (B) has at least two isocyanate groups or blocked isocyanate groups. Examples of a skeleton thereof include an aromatic ring structure, an aliphatic structure, an alicyclic structure, and a heterocyclic structure.

Examples of the aromatic ring structure include aromatic rings and aromatic condensed rings such as a benzene ring, a naphthalene ring, an anthracene ring, and a fluorene ring Examples of the aliphatic structure include aliphatic chain structures having linear and branched chains. Examples of the alicyclic structure include aliphatic monocyclic structures such as a five-membered ring, a six-membered ring, and a seven-membered ring, and aliphatic polycyclic structures such as norbornene.

Examples of the heterocyclic structure include nitrogen-containing ring structures such as pyrrole, imidazole, pyrazole, piperidine, pyridine, indole, and triazinetrione rings, and ring structures having oxygen and sulfur, such as furan and thiophene.

A blocked isocyanate group is an organic group in which an isocyanate group (—N=C=O) is blocked with an appropriate protecting group.

The blocked isocyanate group can be formed by a reaction of an isocyanate group with a blocking agent.

During a reaction of the isocyanate group with the carboxyl group, the amino group, or the imino group in the polymer (A), the blocking agent is removed, and a cross-linking structure is formed by the reaction.

The blocking agent is an active hydrogen-containing compound capable of reacting with an isocyanate. Examples thereof include alcohols, phenols, polycyclic phenols, amides, imides, imines, thiols, oximes, lactams, active hydrogen-containing heterocyclic rings, and active methylene-containing compounds.

Examples of the alcohols as the blocking agent include $C_{1-40}$ alcohols. Examples thereof include methanol, ethanol, propanol, isopropanol, butanol, pentanol, hexanol, octanol, ethylene chlorohydrin, 1,3-dichloro-2-propanol, tert-butanol, tert-pentanol, 2-ethylhexanol, cyclohexanol, lauryl alcohol, ethylene glycol, butylene glycol, trimethylolpropane, glycerin, ethylene glycol monomethyl ether, ethylene glycol monoethyl ether, ethylene glycol monobutyl ether, diethylene glycol monomethyl ether, propylene glycol monomethyl ether, propylene glycol monoethyl ether, and benzyl alcohol.

Examples of the phenols as the blocking agent include $C_{6-20}$ phenols. Examples thereof include phenol, chlorophenol, and nitrophenol.

Examples of the phenol derivative as the blocking agent include $C_{6-20}$ phenol derivatives. Examples thereof include para-tert-butylphenol, cresol, xylenol, and resorcinol.

Examples of the polycyclic phenols as the blocking agent include $C_{10-20}$ polycyclic phenols, which are an aromatic condensed ring having a phenolic hydroxyl group. Examples thereof include hydroxynaphtalene and hydroxyanthracene.

Examples of the amides as the blocking agent include $C_{1-20}$ amides. Examples thereof include acetanilide, hexaneamide, octanediamide, succineamide, benzenesulfonamide, and ethanediamide.

Examples of the imides as the blocking agent include $C_{6-20}$ imides. Examples thereof include cyclohexanedicarboxyimide, cyclohexaenedicarboxyimide, benzenedicarboxyimide, cyclobutanedicarboxyimide, and carbodiimide.

Examples of the imines as the blocking agent include $C_{1-20}$ imines. Examples thereof include hexane-1-imine, 2-propaneimine, and ethane-1,2-imine.

Examples of thiols as the blocking agent include $C_{1-20}$ thiols. Examples thereof include ethanethiol, butanethiol, thiophenol, and 2,3-butanedithiol.

Examples of the oximes as the blocking agent include $C_{1-20}$ oximes. Examples thereof include acetoxime, methyl ethyl ketoxime, cyclohexanone oxime, dimethyl ketoxime, methyl isobutyl ketoxime, methyl amyl ketoxime, formamidoxime, acetaldoxime, diacetyl monoxime, benzophenone oxime, and cyclohexane oxime.

Examples of the lactams as the blocking agent include $C_{4-20}$ lactams. Examples thereof include ε-caprolactam, δ-valerolactam, γ-butyrolactam, β-propyllactam, γ-pyrrolidone, and lauryllactam.

The active hydrogen-containing heterocyclic compounds as the blocking agent are active hydrogen-containing heterocyclic $C_{3-30}$ compounds. Examples thereof include pyrrole, imidazole, pyrazole, piperidine, piperazine, morpholine, pyridine, indole, indazole, purine, and carbazole.

Examples of the active methylene-containing compounds as the blocking agent include active methylene-containing $C_{3-20}$ compounds. Examples thereof include dimethyl malonate, diethyl malonate, methyl acetoacetate, ethyl acetoacetate, and acetylacetone.

The film-forming composition of the present invention can be dissolved in an organic solvent for spin coating. When a solution in which the polymer is dissolved in the organic solvent has a viscosity of 0.001 to 5,000 Pa·s, a coating liquid that exhibits spin coating properties can be obtained.

The organic solvent is not particularly limited as long as it is a solvent usable at another process for a semiconductor. Ketones such as cyclohexanone, methyl isoamyl ketone, and 2-heptanone; polyhydric alcohols or derivatives thereof such as monomethyl ether, monoethyl ether, monopropyl ether, monobutyl ether, and monophenyl ether of ethylene glycol, ethylene glycol monoacetate, diethylene glycol, diethylene glycol monoacetate, propylene glycol, propylene glycol monoacetate, dipropylene glycol, and dipropylene glycol monoacetate; cyclic ethers such as dioxane; or esters such as methyl lactate, ethyl lactate, methyl acetate, ethyl acetate, butyl acetate, methyl pyruvate, ethyl pyruvate, methyl methoxypropionate, and ethyl ethoxypropionate are preferably used. The organic solvent may be used alone, or a mixture of two or more kinds thereof may be used.

To the film-forming composition according to the embodiment, a commonly used additive such as an additive having a miscibility, for example, a surfactant to improve coating performance, an additional resin, and a stabilizer may be added as long as substantial properties in the present invention are not impaired.

Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorosurfactants including EFTOP (registered trademark) EF301, EF303, and EF352 (available from JEMCO), MEGAFACE (registered trademark) F171, F173, R30, R-30N, and R-40LM (available from DIC Corporation), Fluorad FC430 and FC431 (available from Sumitomo 3M, Ltd.), Asahi Guard (registered trademark) AG710, and Surflon (registered trademark) S-382, SC101, SC102, SC103, SC104, SC105, and SC106 (available from Asahi Glass Co., Ltd.), and organosiloxane polymer KP341 (available from Shin-Etsu Chemical Co., Ltd.). The surfactant may be added alone, or two or more kinds thereof may be added in combination. The amount thereof in the whole solid content is, for example, 0.01% by mass to 10% by mass.

As the additional resin (polymer), addition polymerization polymers or condensation polymerization polymers such as polyester, polystyrene, polyimide, acrylic polymer, methacrylic polymer, polyvinylether, phenol novolac, naphthol novolac, polyether, polyamide, and polycarbonate can be used. A polymer having an aromatic ring structure such as a benzene ring, a naphthalene ring, an anthracene ring, a triazine ring, a quinoline ring, and a quinoxaline ring is preferably used.

Examples of the additional resin (polymer) include addition polymerization polymers containing as a structural unit an addition polymerizable monomer such as benzyl acrylate, benzyl methacrylate, phenyl acrylate, naphthyl acrylate, anthryl methacrylate, anthrylmethyl methacrylate, styrene, hydroxystyrene, benzyl vinyl ether, and N-phenyl maleimide, and condensation polymerization polymers such as phenol novolac and naphthol novolac.

Further, a polymer having no aromatic ring structure can be used as the additional resin (polymer). Examples of the polymer include addition polymerization polymers containing as a structural unit only an addition polymerizable monomer having no aromatic ring structure such as alkyl acrylate, alkyl methacrylate, vinyl ether, alkyl vinyl ether, acrylonitrile, maleimide, N-alkylmaleimide, and maleic acid anhydride.

When the addition polymerization polymer is used as the additional resin (polymer), the polymer may be a homopolymer or a copolymer. In production of the additional polymerization polymer, an addition polymerizable monomer is used. Examples of the addition polymerizable monomer include acrylic acid, methacrylic acid, acrylic acid ester compounds, methacrylic acid ester compounds, acrylamide compounds, methacrylamide compounds, vinyl compounds, styrene compounds, maleimide compounds, maleic acid anhydride, and acrylonitrile.

Examples of the acrylic acid ester compounds include methyl acrylate, ethyl acrylate, n-hexyl acrylate, isopropyl acrylate, cyclohexyl acrylate, benzyl acrylate, phenyl acrylate, anthrylmethyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic-6-lactone, 3-acryloxypropyltriethoxysilane, and glycidyl acrylate.

Examples of the methacrylic acid ester compounds include methyl methacrylate, ethyl methacrylate, n-hexyl methacrylate, isopropyl methacrylate, cyclohexyl methacrylate, benzyl methacrylate, phenyl methacrylate, anthrylmethyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate, 5-methacryloyloxy-6-hydroxynorbornene-2-carboxylic-6-lactone, 3-methacryloxypropyltriethoxysilane, glycidyl methacrylate, 2-phenylethyl methacrylate, hydroxyphenyl methacrylate, and bromophenyl methacrylate.

Examples of the acrylamide compounds include acrylamide, N-methyl acrylamide, N-ethyl acrylamide, N-benzyl acrylamide, N-phenyl acrylamide, N,N-dimethyl acrylamide, and N-anthryl acrylamide.

Examples of the methacrylamide compounds include methacrylamide, N-methyl methacrylamide, N-ethyl methacrylamide, N-benzyl methacrylamide, N-phenyl methacrylamide, N,N-dimethyl methacrylamide, and N-anthryl acrylamide.

Examples of the vinyl compounds include vinyl alcohol, 2-hydroxyethyl vinyl ether, methyl vinyl ether, ethyl vinyl ether, benzyl vinyl ether, vinyl acetate, vinyl trimethoxysilane, 2-chloroethyl vinyl ether, 2-methoxyethyl vinyl ether, vinylnaphthalene, and vinylanthracene.

Examples of the styrene compounds include styrene, hydroxystyrene, chlorostyrene, bromostyrene, methoxystyrene, cyanostyrene, and acetylstyrene.

Examples of the maleimide compounds include maleimide, N-methylmaleimide, N-phenylmaleimide, N-cyclohexylmaleimide, N-benzylmaleimide, and N-hydroxyethylmaleimide.

For example, the weight average molecular weight that is the molecular weight of the additional resin (polymer) used in the film-forming composition of the present invention is 1,000 to 1,000,000, 3,000 to 300,000, or 5,000 to 100,000.

The thermosetting resin composition in the present invention may not always include a crosslinker other than the isocyanate groups or the blocked isocyanate groups. However, when the crosslinker is used, examples thereof include nitrogen-containing compounds having nitrogen atom that are substituted by an alkoxymethyl group such as a methoxymethyl group, an ethocymethyl group, a butoxymethyl group, and a hexyloxymethyl group, or a hydroxymethyl group. As the crosslinker, a phenol group-containing compound, an allyl group-containing compound, an allyl group-containing polymer, an isocyanate group-containing compound, or an isocyanate group-containing polymer may be used.

Examples of the nitrogen-containing compound include nitrogen-containing compounds such as hexamethoxy methyl melamine, tetramethoxymethyl benzoguanamine, 1,3,4,6-tetrakis(butoxymethyl) glycoluril, 1,3,4,6-tetrakis(hydroxymethyl) glycoluril, 1,3-bis(hydroxymethyl)urea, 1,1,3,3-tetrakis(butoxymethyl)urea, 1,1,3,3-tetrakis(methoxymethyl)urea, 1,3-bis(hydroxymethyl)-4,5-dihydroxy-2-imidazolinone, and 1,3-bis(methoxymethyl)-4,5-dimethoxy-2-imidazolinone. Examples of the crosslinker include commercially available products including a methoxymethyl-type melamine compound available from Nihon Cytec Industries Inc. (trade name: CYMEL (registered trademark) 300, 301, 303, and 350), a butoxymethyl-type melamine compound (trade name: MYCOAT (registered trademark) 506 and 508), a glycoluril compound (trade name: CYMEL (registered trademark) 1170 and POWDERLINK (registered trademark) 1174), a methylated urea resin (trade name: UFR65), a butylated urea resin (trade name: UFR300, U-VAN10S60, U-VAN10R, and U-VAN11HV), and an urea-formaldehyde-based resin available from DIC Corporation (highly condensed, trade name: BECKAMINE (registered trademark) J-300S, P-955, and N).

As the crosslinker, one kind of the compound may be used alone, or two or more kinds thereof may be used in combination. The crosslinker may be used in an amount of 1% by mass to 50% by mass, 8% by mass to 40% by mass, or 15% by mass to 30% by mass relative to the polymer contained in the thermosetting resin composition of the present invention.

The thermosetting resin composition in the present invention may contain a cross-linking catalyst in addition to the crosslinker. Use of the cross-linking catalyst promotes a reaction of the crosslinker. Examples of the cross-linking catalyst include p-toluenesulfonic acid, trifluoromethanesulfonic acid, methanesulfonic acid, pyridinium p-toluenesulfonate, salicylic acid, camphorsulfonic acid, 5-sulfosalicylic acid, citric acid, benzoic acid, hydroxybenzoic acid, 4-chlorobenzenesulfonic acid, 4-hydroxybenzenesulfonic acid, benzenedisulfonic acid, and 1-naphthalenesulfonic acid. One kind of the cross-linking catalyst may be used alone, or two or more kinds thereof may be used in combination. The cross-linking catalyst may be used in an amount of 0.01% by mass to 10% by mass, 0.05% by mass to 8% by mass, 0.1% by mass to 5% by mass, 0.3% by mass to 3% by mass, or 0.5% by mass to 1% by mass relative to the polymer contained in the thermosetting resin composition of the present invention.

When the film-forming composition of the present invention contains the additional resin (polymer), the content thereof in the solid content is 0 to 40% by mass, 0 to 20% by mass, or 1 to 19% by mass.

The present invention also relates to an insulating film formed from a cured film of the film-forming composition of the above-mentioned present invention. Specifically, the insulating film is obtained by applying the film-forming composition to a substrate and curing the composition.

In the present invention, the thickness of a film that is obtained by applying the film-forming composition to the substrate by spin coating using a device such as a spin coater may be 0.1 μm or more and 100 μm or less. When the thickness is too thin, the insulation properties may not be sufficiently obtained. When it is too thick, a crack may occur in the insulating film. Therefore, the thickness is preferably 0.5 μm to 10 μm.

After coating, the composition may be cured by baking at a temperature of 100 to 350° C., 100 to 300° C., or 100 to 250° C., and typically a relatively low temperature of 150° C. to 200° C. including about 180° C. for about 0.5 minutes to 180 minutes, 0.5 minutes to 120 minutes, or 1 minute to 60 minutes.

After the film-forming composition is applied to the substrate and the solvent is removed by drying, the polymer and the crosslinker that are contained as a solid content may be cured at a relatively low temperature. The insulating film may be used as a protective film of covering a polished face of a thinned wafer or as a film of protecting a circuit face formed on a back surface of a thinned wafer.

Further, the present invention relates to a method for producing an insulating film comprising steps of applying an adhesion enhancing film-forming composition containing a polysiloxane to a substrate and curing the composition to form an adhesion enhancing film, and applying the film-forming composition to the film and curing the composition.

The adhesion enhancing film-forming composition contains a polysiloxane and a solvent, and if necessary, may contain a surfactant and a curing catalyst such as an onium salt and an amine. The solid content thereof is 0.01 to 10% by mass. The content of the polysiloxane in the solid content is 50 to 100% by mass or 90 to 99% by mass. The polysiloxane is obtained by hydrolyzing alkoxysilane in the organic solvent using an acid or alkali as a hydrolysis catalyst. The weight average molecular weight thereof is about 500 to about 100,000 or about 500 to about 10,000.

Examples of the solvent and the surfactant include the above-described examples.

The insulating film may be used as a film of covering a polished face of a thinned wafer. Further, the insulating film may be used as a film of protecting a circuit face of a thinned wafer.

EXAMPLES

Hereinafter, the present invention will be more specifically described with reference to Examples and Comparative Examples, but the present invention is not limited to the Examples.

Synthesis of Resin for Film-Forming Composition

Synthesis Example 1

In a three-neck flask equipped with a stirrer, a thermometer, and a Dimroth condenser, 16.52 g of 2,6-difluorobenzonitrile, 8.59 g of diphenolic acid, and 23.54 g of 2,2-bis(4-hydroxyphenyl)hexafluoropropane were dissolved in 194.58 g of 1-methyl-2-pyrrolidinone, and 27.64 g of potassium carbonate was added. The inside of the system was replaced with nitrogen. The mixture was reacted for 20 hours in an oil bath of 160° C. After completion of the reaction, the reaction solution was filtered with suction using a Kiriyama funnel. To the obtained filtrate, a solution of 2N-hydrochloric acid and 1-methyl-2-pyrrolidinone at a ratio of 1:9 was added until the solution became acidic. Using a pH test paper, the solution was checked to be acidic. Subsequently, the resultant solution was added dropwise to a mixed solution of water and methanol at a ratio 1:9, resulting in reprecipitation. After the addition, the resultant precipitate was collected by filtration with suction using a Buchner funnel, and washed with a mixed solution of water and methanol at a ratio of 1:9. The resulting powder was dried for 12 hours using a reduced-pressure dryer heated to 60° C. to obtain an aromatic polyether. The aromatic polyether was a polymer having structures of Formulae (A-1-1) and (A-2-4) at a molar ratio of 30:70. The aromatic polyether was analyzed by GPC. The weight average molecular weight in terms of standard polystyrene was 11,800.

Synthesis Example 2

In a three-neck flask equipped with a stirrer, a thermometer, and a Dimroth condenser, 20.73 g of 4,4'-difluorobenzophenone, 8.59 g of diphenolic acid, and 23.54 g of 2,2-bis(4-hydroxyphenyl)hexafluoropropane were dissolved in 211.42 g of 1-methyl-2-pyrrolidinone, and 27.64 g of potassium carbonate was added. The inside of the system was replaced with nitrogen. The mixture was reacted for 20 hours in an oil bath of 160° C. After completion of the reaction, the reaction solution was filtered with suction using a Kiriyama funnel. To the obtained filtrate, a solution of 2N-hydrochloric acid and 1-methyl-2-pyrrolidinone at a ratio of 1:9 was added until the solution became acidic. Using a pH test paper, the solution was checked to be acidic. Subsequently, the resultant solution was added dropwise to a mixed solution of water and methanol at a ratio 1:9, resulting in reprecipitation. After the addition, the resultant precipitate was collected by filtration with suction using a Buchner funnel, and washed with a mixed solution of water and methanol at a ratio of 1:9. The resulting powder was dried for 12 hours using a reduced-pressure dryer heated to 60° C. to obtain an aromatic polyether. The aromatic polyether was a polymer having structures of Formulae (A-1-2) and (A-2-5) at a molar ratio of 30:70. The aromatic polyether was analyzed by GPC. The weight average molecular weight in terms of standard polystyrene was 17,300.

Synthesis Example 3

In a three-neck flask equipped with a stirrer, a thermometer, and a Dimroth condenser, 20.73 g of 4,4'-difluorobenzophenone, 7.33 g of 2,2-bis(3-amino-4-hydroxyphenyl)hexafluoropropane, and 26.90 g of 2,2-bis(4-hydroxyphenyl)hexafluoropropane were dissolved in 219.81 g of 1-methyl-2-pyrrolidinone, and 27.64 g of potassium carbonate was added. The inside of the system was replaced with nitrogen. The mixture was reacted for 20 hours in an oil bath of 160° C. After completion of the reaction, the reaction solution was filtered with suction using a Kiriyama funnel. To the obtained filtrate, a solution of 2N-hydrochloric acid and 1-methyl-2-pyrrolidinone at a ratio of 1:9 was added until the solution became acidic. Using a pH test paper, the solution was checked to be acidic. Subsequently, the resultant solution was added dropwise to a mixed solution of water and methanol at a ratio 1:9, resulting in reprecipitation. After the addition, the resultant precipitate was collected by filtration with suction using a Buchner funnel, and washed with a mixed solution of water and methanol at a ratio of 1:9. The resulting powder was dried for 12 hours using a reduced-pressure dryer heated to 60° C. to obtain an aromatic polyether. The aromatic polyether was a polymer having structures of Formulae (A-1-17) and (A-2-5) at a molar ratio of 20:80. The aromatic polyether was analyzed by GPC. The weight average molecular weight in terms of standard polystyrene was 41,900.

Synthesis Example 4

In a three-neck flask equipped with a stirrer, a thermometer, and a Dimroth condenser, 31.09 g of 4,4'-difluorobenzophenone, 16.48 g of 2,2-bis(3-amino-4-hydroxyphenyl)hexafluoropropane, 25.98 g of 1,3-bis[2-(4-hydroxyphenyl)-2-propyl]benzene, and 10.09 g of 2,2-bis(4-hydroxyphenyl)hexafluoropropane were dissolved in 334.59 g of 1-methyl-2-pyrrolidinone, and 41.46 g of potassium carbonate was added. The inside of the system was replaced with nitrogen. The mixture was reacted for 20 hours in an oil bath of 160° C. After completion of the reaction, the reaction solution was filtered with suction using a Kiriyama funnel. To the obtained filtrate, a solution of 2N-hydrochloric acid and 1-methyl-2-pyrrolidinone at a ratio of 1:9 was added until the solution became acidic. Using a pH test paper, the solution was checked to be acidic. Subsequently, the resultant solution was added dropwise to a mixed solution of water and methanol at a ratio 1:9, resulting in reprecipitation. After the addition, the resultant precipitate was collected by filtration with suction using a Buchner funnel, and washed with a mixed solution of water and methanol at a ratio of 1:9. The resulting powder was dried for 12 hours using a reduced-pressure dryer heated to 60° C. to obtain an aromatic polyether. The aromatic polyether was a polymer having structures of Formulae (A-1-17), (A-2-2), and (A-2-5) at a molar ratio of 30:50:20. The aromatic polyether was analyzed by GPC. The weight average molecular weight in terms of standard polystyrene was 12,200.

Synthesis Example 5

In a three-neck flask equipped with a stirrer, a thermometer, and a Dimroth condenser, 31.09 g of 4,4'-difluorobenzophenone, 10.99 g of 2,2-bis(3-amino-4-hydroxyphenyl)hexafluoropropane, 26.28 g of 9,9-bis(4-hydroxyphenyl)fluorene, and 15.13 g of 2,2-bis(4-hydroxyphenyl)hexafluoropropane were dissolved in 333.97 g of 1-methyl-2-pyrrolidinone, and 41.46 g of potassium carbonate was added. The inside of the system was replaced with nitrogen. The mixture was reacted for 20 hours in an oil bath of 160° C. After completion of the reaction, the reaction solution was filtered with suction using a Kiriyama funnel. To the obtained filtrate, a solution of 2N-hydrochloric acid and 1-methyl-2-pyrrolidinone at a ratio of 1:9 was added until the solution became acidic. Using a pH test paper, the solution was checked to be acidic. Subsequently, the resultant solution was added dropwise to a mixed solution of water and methanol at a ratio 1:9, resulting in reprecipitation. After the addition, the resultant precipitate was collected by filtration with suction using a Buchner funnel, and washed with a mixed solution of water and methanol at a ratio of 1:9. The resulting powder was dried for 12 hours using a reduced-pressure dryer heated to 60° C. to obtain an aromatic polyether. The aromatic polyether was a polymer having structures of Formulae (A-1-17), (A-2-11), and (A-2-5) at a molar ratio of 20:50:30. The aromatic polyether was analyzed by GPC. The weight average molecular weight in terms of standard polystyrene was 14,000.

Synthesis Example 6

In a three-neck flask equipped with a stirrer, a thermometer, and a Dimroth condenser, 62.19 g of 4,4'-difluorobenzophenone, 21.98 g of 2,2-bis(3-amino-4-hydroxyphenyl)hexafluoropropane, 51.97 g of 1,3-bis[2-(4-hydroxyphenyl)-2-propyl]benzene, and 30.26 g of 2,2-bis(4-hydroxyphenyl)hexafluoropropane were dissolved in 665.57 g of 1-methyl-2-pyrrolidinone, and 82.93 g of potassium carbonate was added. The inside of the system was replaced with nitrogen. The mixture was reacted for 20 hours in an oil bath of 160° C. After completion of the reaction, the reaction solution was filtered with suction using a Kiriyama funnel. To the obtained filtrate, a solution of 2N-hydrochloric acid and 1-methyl-2-pyrrolidinone at a ratio of 1:9 was added until the solution became acidic. Using a pH test paper, the solution was checked to be acidic. Subsequently, the resultant solution was added dropwise to a mixed solution of water and methanol at a ratio 1:9, resulting in reprecipitation. After the addition, the resultant precipitate was collected by filtration with suction using a Buchner funnel, and washed with a mixed solution of water and methanol at a ratio of 1:9. The resulting powder was dried for 12 hours using a reduced-pressure dryer heated to 60° C. to obtain an aromatic polyether. The aromatic polyether was a polymer having structures of Formulae (A-1-17), (A-2-2), and (A-2-5) at a molar ratio of 20:50:30. The aromatic polyether was analyzed by GPC. The weight average molecular weight in terms of standard polystyrene was 12,800.

Comparative Synthesis Example 1

In a three-neck flask equipped with a stirrer, a thermometer, and a Dimroth condenser, 10.36 g of 4,4'-difluorobenzophenone and 16.81 g of 2,2-bis(4-hydroxyphenyl)hexafluoropropane were dissolved in 108.70 g of 1-methyl-2-pyrrolidinone, and 27.64 g of potassium carbonate was added. The inside of the system was replaced with nitrogen. The mixture was reacted for 20 hours in an oil bath of 160° C. After completion of the reaction, the reaction solution was filtered with suction using a Kiriyama funnel. To the obtained filtrate, a solution of 2N-hydrochloric acid and 1-methyl-2-pyrrolidinone at a ratio of 1:9 was added until the solution became acidic. Using a pH test paper, the solution was checked to be acidic. Subsequently, the resultant solution was added dropwise to methanol, resulting in reprecipitation. After the addition, the resultant precipitate was collected by filtration with suction using a Buchner funnel, and washed with methanol. The resulting powder was dried for 12 hours using a reduced-pressure dryer heated to 80° C. to obtain an aromatic polyether. The aromatic polyether was a polyether having a structure of Formula (A-2-4). The aromatic polyether was analyzed by GPC. The weight average molecular weight in terms of standard polystyrene was 24,000.

Comparative Synthesis Example 2

In a three-neck flask equipped with a stirrer, a thermometer, and a Dimroth condenser, 13.33 g of 4,4'-(hexafluoroisopropylidene)diphthalic anhydride and 7.08 g of 4,4'-diaminodiphenylsulfone were dissolved in 81.62 g of 1-methyl-2-pyrrolidinone. The inside of the system was replaced with nitrogen. The mixture was reacted for 20 hours in an oil bath of 50° C. After completion of the reaction, the resultant solution was added dropwise to a mixed solution of water and isopropyl alcohol at a ratio 1:9, resulting in reprecipitation. After the addition, the resultant precipitate was collected by filtration with suction using a Buchner funnel, and washed with a mixed solution of water and isopropyl alcohol at a ratio of 1:9. The resulting powder was dried for 12 hours using a reduced-pressure dryer heated to 50° C. to obtain polyamic acid as a polyimide precursor. The obtained polymer was a polymer having a unit structure of Formula (C-1-1). The polyamic acid was analyzed by GPC. The weight average molecular weight in terms of standard polystyrene was 14,000. In a film formed from a film-forming composition containing the obtained polymer, the unit structure of the polymer was changed to a unit structure of Formula (C-1-1') after heating.

Formula (C-1-1)

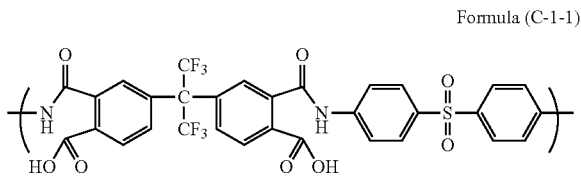

Formula (C-1-1')

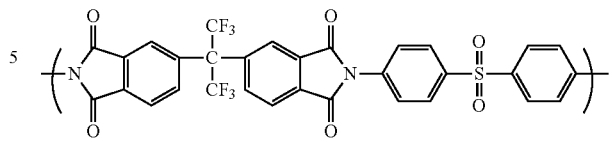

Comparative Synthesis Example 3

In a three-neck flask equipped with a stirrer, a thermometer, and a Dimroth condenser, 278.23 g of 4,4'-difluorobenzophenone, 274.72 g of 2,2-bis(3-amino-4-hydroxyphenyl)hexafluoropropane, and 187.70 g of 4,4'-dihydroxydiphenylsulfone were dissolved in 2221.81 g of 1-methyl-2-pyrrolidinone, and 626.57 g of potassium carbonate was added. The inside of the system was replaced with nitrogen. The mixture was reacted for 20 hours in an oil bath of 160° C.

After completion of the reaction, the temperature in the system was cooled to 80° C., and 373.50 g of propargyl bromide dissolved in 1578.81 g of 1-methyl-2-pyrrolidinone, 621.95 g of potassium carbonate, and 373.24 g of potassium iodide were added. The mixture was stirred at 80° C. for 20 hours, resulting in a reaction of a phenol group and an amino group on terminals of the polymer.

After completion of the reaction, the reaction solution was filtered with suction using a Kiriyama funnel. To the obtained filtrate, a solution of 2N-hydrochloric acid and 1-methyl-2-pyrrolidinone at a ratio of 1:9 was added until the solution became acidic. Using a pH test paper, the solution was checked to be acidic. Subsequently, the resultant solution was added dropwise to a mixed solution of water and methanol at a ratio 1:9, resulting in reprecipitation. After the addition, the resultant precipitate was collected by filtration with suction using a Buchner funnel, and washed with a mixed solution of water and methanol at a ratio of 1:9. The resulting powder was dried for 12 hours using a reduced-pressure dryer heated to 50° C. to obtain an aromatic polyether. The obtained polymer was a polymer having structures of Formulae (C-1-2) and (A-2-9) at a molar ratio of 50:50. The aromatic polyether was analyzed by GPC. The weight average molecular weight in terms of standard polystyrene was 12,000.

Formula (C-1-2)

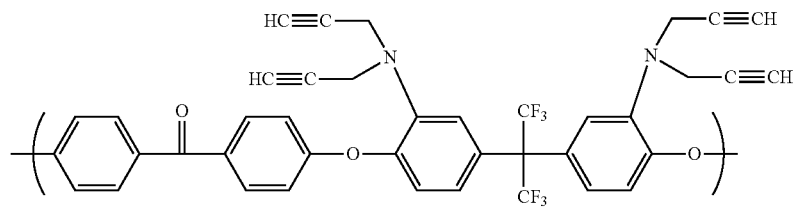

Formula (A-2-9)

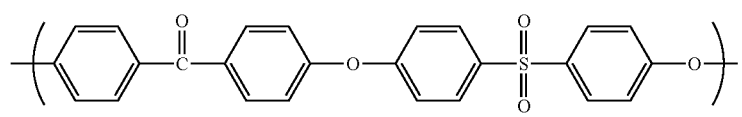

Synthesis of Resin for Adhesion Enhancing
Film-Forming Composition

Synthesis Example 7

6.20 g (50% by mole) of tetraethoxysilane, 12.30 g (50% by mole) of (3-(triethoxysilylpropyl)diallyl isocyanurate, and 27.75 g of acetone were placed in a 100-mL flask, and 3.75 g of 0.01 mol/L hydrochloric acid was added dropwise to the mixed solution with stirring using a magnetic stirrer. After the addition, the flask was placed into an oil bath adjusted to 85° C., and a reaction was caused for 240 minutes under heating reflux. The reaction solution was then cooled to room temperature. 36.00 g of propylene glycol monomethyl ether acetate was added to the reaction solution, and ethanol, water, hydrochloric acid, and acetone as a reaction byproduct were distilled off under reduced pressure. The reaction solution was concentrated to obtain a solution of propylene glycol monomethyl ether acetate as a hydrolysis-condensation product (polymer). The concentration was adjusted to 30% by weight in terms of solid residue at 140° C. The obtained polysiloxane was analyzed by GPC. The weight average molecular weight in terms of standard polystyrene was 1,300.

Synthesis Example 8

7.64 g (50% by mole) of tetraethoxysilane, 10.51 g (50% by mole) of (4-(1-ethoxyethoxy)phenyl)trimethoxysilane, and 27.75 g of acetone were placed in a 100-mL flask, and 4.63 g of 0.01 mol/L hydrochloric acid was added dropwise to the mixed solution with stirring by using a magnetic stirrer. After the addition, the flask was placed into an oil bath adjusted to 85° C., and a reaction was caused for 240 minutes under heating reflux. The reaction solution was then cooled to room temperature. 36.00 g of propylene glycol monomethyl ether acetate was added to the reaction solution, and ethanol, methanol, water, hydrochloric acid, and acetone as a reaction byproduct were distilled off under reduced pressure. The reaction solution was concentrated to obtain a solution of propylene glycol monomethyl ether acetate as a hydrolysis-condensation product (polymer). The concentration was adjusted to 30% by weight in terms of solid residue at 140° C. The obtained polysiloxane was analyzed by GPC. The weight average molecular weight in terms of standard polystyrene was 1,200.

Preparation of Thermosetting Resin Composition

Example 1

20.00 g of the aromatic polyether obtained in Synthesis Example 1 and 6.00 g of polyfunctional blocked isocyanate VESTANAT, B1358/100 (blocked polyisocyanate protected with an oxime group, based on an isophorone diisocyanate structure, available from Evonik Industries AG) were dissolved in 60.67 g of propylene glycol monomethyl ether acetate, and the mixture was then filtered through a microfilter with a pore diameter of 1.0 μm made of polyethylene to prepare a resin solution containing 30% by mass of solid content.

Example 2

20.00 g of the aromatic polyether obtained in Synthesis Example 2 and 6.00 g of polyfunctional blocked isocyanate VESTANAT, B1358/100 (blocked polyisocyanate protected with an oxime group, based on an isophorone diisocyanate structure, available from Evonik Industries AG) were dissolved in 60.67 g of propylene glycol monomethyl ether acetate, and the mixture was then filtered through a microfilter with a pore diameter of 1.0 μm made of polyethylene to prepare a resin solution containing 30% by mass of solid content.

Example 3

20.00 g of the aromatic polyether obtained in Synthesis Example 3 and 6.00 g of polyfunctional blocked isocyanate VESTANAT, B1358/100 (blocked polyisocyanate protected with an oxime group, based on an isophorone diisocyanate structure, available from Evonik Industries AG) were dissolved in 60.67 g of propylene glycol monomethyl ether acetate, and the mixture was then filtered through a microfilter with a pore diameter of 1.0 μm made of polyethylene to prepare a resin solution containing 30% by mass of solid content.

Example 4

20.00 g of the aromatic polyether obtained in Synthesis Example 4 and 9.00 g of polyfunctional blocked isocyanate VESTANAT, B1358/100 (blocked polyisocyanate protected with an oxime group, based on an isophorone diisocyanate structure, available from Evonik Industries AG) were dissolved in 67.67 g of propylene glycol monomethyl ether acetate, and the mixture was then filtered through a microfilter with a pore diameter of 1.0 μm made of polyethylene to prepare a resin solution containing 30% by mass of solid content.

Example 5

20.00 g of the aromatic polyether obtained in Synthesis Example 4 and 6.00 g of polyfunctional blocked isocyanate VESTANAT, B1358/100 (blocked polyisocyanate protected with an oxime group, based on an isophorone diisocyanate structure, available from Evonik Industries AG) were dissolved in 60.67 g of propylene glycol monomethyl ether acetate, and the mixture was then filtered through a microfilter with a pore diameter of 1.0 μm made of polyethylene to prepare a resin solution containing 30% by mass of solid content.

Example 6

20.00 g of the aromatic polyether obtained in Synthesis Example 5 and 6.00 g of polyfunctional blocked isocyanate VESTANAT, B1358/100 (blocked polyisocyanate protected with an oxime group, based on an isophorone diisocyanate structure, available from Evonik Industries AG) were dissolved in 60.67 g of propylene glycol monomethyl ether acetate, and the mixture was then filtered through a microfilter with a pore diameter of 1.0 μm made of polyethylene to prepare a resin solution containing 30% by mass of solid content.

Example 7

20.00 g of the aromatic polyether obtained in Synthesis Example 6 and 6.00 g of polyfunctional blocked isocyanate VESTANAT, B1358/100 (blocked polyisocyanate protected with an oxime group, based on an isophorone diisocyanate structure, available from Evonik Industries AG) were dissolved in 60.67 g of propylene glycol monomethyl ether acetate, and the mixture was then filtered through a microfilter with a pore diameter of 1.0 μm made of polyethylene to prepare a resin solution containing 30% by mass of solid content.

Comparative Example 1

26.00 g of the aromatic polyether obtained in Comparative Synthesis Example 1 was dissolved in 60.67 g of propylene glycol monomethyl ether acetate, and the mixture was then filtered through a microfilter with a pore diameter of 1.0 μm made of polyethylene to prepare a resin solution containing 30% by mass of solid content.

Comparative Example 2

26.00 g of the polyamic acid obtained in Comparative Synthesis Example 2 was dissolved in 60.67 g of cyclohexanone, and the mixture was then filtered through a microfilter with a pore diameter of 1.0 μm made of polyethylene to prepare a resin solution containing 30% by mass of solid content.

26.00 g of the aromatic polyether obtained in Comparative Synthesis Example 3 was dissolved in 60.67 g of cyclohexanone, and the mixture was then filtered through a microfilter with a pore diameter of 1.0 μm made of polyethylene to prepare a resin solution containing 30% by mass of solid content.

<Evaluation of Thermosetting Resin Composition>

The solvent resistance, adhesion, electrical insulation properties, and heat resistance of each of the resin solutions obtained in Examples 1 to 7 and Comparative Examples 1 to 3 were evaluated.

<Solvent Resistance>

The resin solution obtained in each of Examples 1 to 7 and Comparative Examples 1 to 3 was applied to a silicon wafer using a spin coater and baked at 180° C. for 60 minutes to form a resin film. From a remaining film ratio after immersion of each of the resin films in propylene glycol monomethyl ether (PGME), propylene glycol monomethyl ether acetate (PGMEA), cyclohexanone (CYH), or N-methyl-2-pyrrolidinone (NMP) at 23° C. for 1 minute, the solvent resistance of each of the resin films was evaluated. A residual film ratio of 90% or more was determined as ⊚, a remaining film ratio of 80% or more and less than 90% was determined as ○, and a residual film ratio of less than 80% was determined as x. The results are shown in Table 1.

<Evaluation of Adhesion>

The resin solution obtained in each of Examples 1 to 7 and Comparative Examples 1 to 3 was applied to a silicon wafer using a spin coater and baked at 180° C. for 60 minutes to form a resin film. The formed resin films were subjected to a cross-cut test (JIS, K5400). From the number of squares remained on the wafer, the adhesion was evaluated. A case where 100 squares in 100 squares remained was determined as ⊚, a case where 90 to 99 squares remained was determined as ○, and a case where 89 or less squares remained was determined as x. The results are shown in Table 2.

<Evaluation of Electrical Insulation Properties>

The resin solution obtained in each of Examples 1 to 7 and Comparative Examples 1 to 3 was applied to a silicon wafer having low electrical resistance using a spin coater and baked at 180° C. for 60 minutes to form a resin film. For the electrical insulation properties of the films, a leakage current density (A/cm$^2$) at which an electric field intensity of 1 MV/cm, 3 MV/cm, and 5 MV/cm was applied through a mercury probe (CVmap92-A manufactured by Four Dimensions, Inc.) was measured. A leakage current density of less than $1\times10^{-8}$ was determined as ⊚, a leakage current density of $1\times10^{-8}$ or more and less than $1\times10^{-7}$ was determined as ○, and a leakage current density of $1\times10^{-7}$ or more was determined as x. The results are shown in Table 3.

<Evaluation of Heat Resistance>

The resin solution obtained in each of Examples 1 to 7 and Comparative Examples 1 to 3 was applied to a silicon wafer using a spin coater and baked at 180° C. for 60 minutes to form a resin film. The formed films were subjected to a heat resistance test at 260° C. for 60 minutes. The heat resistance was evaluated.

(Tackiness)

A 1-cm square silicon wafer was placed on each of the resin films, and the heat resistance test was performed. The silicon wafer was then separated using tweezers. The presence or absence of expression of tackiness was evaluated. A case where the silicon wafer was separated from the resin film was determined not to express tackiness as ⊚, and a case where the silicon wafer was not separated was determined to express tackiness as x.

(Shrink Properties)

A degree of shrinkage of the film before and after the heat resistance test was evaluated. A degree of shrinkage of less than 1% was determined as ⊚, a degree of shrinkage of 1% or more and less than 5% was determined as ○, and a degree of shrinkage of 5% or more was determined as x.

(Electrical Insulation Properties)

For the resin films used in the heat resistance test, a leakage current density (A/cm$^2$) at which an electric field intensity of 3 MV/cm was applied through a mercury probe (CVmap92-A manufactured by Four Dimensions, Inc.) was evaluated. A ratio of the leakage current density after the heat resistance test to that before the heat resistance test of 1.5 or more was determined as ⊚, a ratio of less than 2 was determined as ○, and a ratio of 2 or more was determined as x.

The results are shown in Table 4.

TABLE 1

| | Solvent resistance | | | |
|---|---|---|---|---|
| | PGME | PGMEA | CYH | NMP |
| Example 1 | ⊚ | ⊚ | ⊚ | ○ |
| Example 2 | ⊚ | ⊚ | ⊚ | ⊚ |
| Example 3 | ⊚ | ⊚ | ⊚ | ⊚ |
| Example 4 | ⊚ | ⊚ | ⊚ | ⊚ |
| Example 5 | ⊚ | ⊚ | ⊚ | ⊚ |
| Example 6 | ⊚ | ⊚ | ⊚ | ○ |
| Example 7 | ⊚ | ⊚ | ⊚ | ⊚ |
| Comparative Example 1 | X | X | X | X |
| Comparative Example 2 | X | X | X | X |
| Comparative Example 3 | ○ | X | ○ | X |

TABLE 2

| | Adhesion |
|---|---|
| Example 1 | ⊚ |
| Example 2 | ⊚ |
| Example 3 | ⊚ |
| Example 4 | ⊚ |
| Example 5 | ⊚ |
| Example 6 | ⊚ |

TABLE 2-continued

| Adhesion | |
| --- | --- |
| Example 7 | ◎ |
| Comparative Example 1 | ◎ |
| Comparative Example 2 | X |
| Comparative Example 3 | ◎ |

TABLE 3

| Electric insulation properties | | | |
| --- | --- | --- | --- |
|  | 1 MV/cm | 3 MV/cm | 5 MV/cm |
| Example 1 | ◎ | ◎ | ○ |
| Example 2 | ◎ | ◎ | ○ |
| Example 3 | ◎ | ◎ | ○ |
| Example 4 | ◎ | ◎ | ◎ |
| Example 5 | ◎ | ◎ | ○ |
| Example 6 | ◎ | ◎ | ◎ |
| Example 7 | ◎ | ◎ | ◎ |
| Comparative Example 1 | ◎ | ◎ | ○ |
| Comparative Example 2 | ◎ | X | X |
| Comparative Example 3 | ◎ | ◎ | X |

TABLE 4

| Heat resistance | | | |
| --- | --- | --- | --- |
|  | Tackiness | Shrink Properties | Electric insulation properties |
| Example 1 | ◎ | ○ | ○ |
| Example 2 | ◎ | ○ | ◎ |
| Example 3 | ◎ | ○ | ◎ |
| Example 4 | ◎ | ○ | ◎ |
| Example 5 | ◎ | ○ | ◎ |
| Example 6 | ◎ | ○ | ◎ |
| Example 7 | ◎ | ○ | ◎ |
| Comparative Example 1 | X | ◎ | ○ |
| Comparative Example 2 | ◎ | X | ◎ |
| Comparative Example 3 | ◎ | ○ | X |

As clear in Tables 1 to 4, in a case of the thermosetting resin compositions obtained from the present invention, solvent resistance, adhesion, electric insulation properties, and heat resistance were all good.

On the other hand, in a case of the general aromatic polyether in Comparative Example 1, solvent resistance was not obtained since cross-linking was not performed. At the heat resistance test, the film was molten when the temperature was equal to or higher than the glass transition point. Since an imidization reaction of the polyimide resin in Comparative Example 2 did not sufficiently progress at a relatively low temperature, sufficient solvent resistance was not obtained. At a high temperature during the heat resistance test, heat shrinkage with progression of imidization was deteriorated, and the electrical properties were deteriorated due to remained amic acid. Due to a high internal stress caused by heat shrinkage, the adhesion to the wafer was not obtained. In a case of the aromatic polyether in Comparative Example 3, sufficient solvent resistance was not obtained at a baking temperature of 180° C. At the heat resistance test, electric insulation properties were significantly deteriorated.

<Preparation of Adhesion Enhancing Film-Forming Composition>

The polysiloxane obtained in each of Synthesis Examples 7 and 8, an acid, a curing catalyst, a solvent, and water were mixed at a ratio shown in Table 5. The mixture was filtrated through a fluororesin filter having a pore diameter of 0.02 μm, to prepare a solution of each adhesion film-forming composition. The ratio of the polymer in Table 5 represents the mass of the polymer, but not the mass of a polymer solution.

In Table 5, maleic acid is abbreviated to MA, N-(3-triethyoxysilylpropyl)-4,5-dihydroimidazole is abbreviated to IMIDTEOS, propylene glycol monomethyl ether acetate is abbreviated as PGMEA, propylene glycol monoethyl ether is abbreviated to PGEE, and propylene glycol monomethyl ether is abbreviated to PGME. As the water, ultrapure water was used. Each addition amount is expressed in part(s) by mass.

TABLE 5

| | Polymer | Acid | Curing Catalyst | Solvent |
| --- | --- | --- | --- | --- |
| Example 8 | Synthesis Example 7 | MA | IMIDTEOS | PGME PGEE PGMEA Water |
| (part by mass) | 0.2 | 0.002 | 0.0012 | 10 76 7 7 |
| Example 9 | Synthesis Example 8 | MA | IMIDTEOS | PGME PGEE PGMEA Water |
| (part by mass) | 0.2 | 0.002 | 0.0012 | 10 76 7 7 |

Preparation of Sample for Evaluation of Adhesion

Example 10

The adhesion enhancing film-forming composition in Example 8 was applied to a silicon wafer using a spin coater and baked at 140° C. for 1 minute to form an adhesion film. The resin solution in Example 7 was applied to the adhesion film using a spin coater and baked at 180° C. for 60 minutes to form a resin film.

Example 11

The adhesion enhancing film-forming composition in Example 9 was applied to a silicon wafer using a spin coater and baked at 140° C. for 1 minute to form an adhesion film. The resin solution in Example 7 was applied to the adhesion film using a spin coater and baked at 180° C. for 60 minutes to form a resin film.

Comparative Example 4

The resin solution in Comparative Example 1 was applied to a silicon wafer using a spin coater and baked at 180° C. for 60 minutes to form a resin film.

Comparative Example 5

The resin solution in Comparative Example 3 was applied to a silicon wafer using a spin coater and baked at 180° C. for 60 minutes to form a resin film.

<Evaluation of Adhesion>

The adhesion of the film prepared in each of Examples 10 and 11 and Comparative Examples 4 and 5 was evaluated from the number of squares remained on the wafer at a cross-cut test (JIS K5400) before and after a high temperature and high humidity test at 85° C. and 85% RH for 168 hours. A case where 100 squares in 100 squares remained was determined as ⊚, a case where 90 to 99 squares remained was determined as ○, and a case where 89 or less squares remained was determined as x. The results are shown in Table 6.

TABLE 6

Evaluation of adhesion

|  | Before high temperature and high humidity test | After high temperature and high humidity test |
|---|---|---|
| Example 10 | ⊚ | ⊚ |
| Example 11 | ⊚ | ⊚ |
| Comparative Example 4 | ⊚ | X |
| Comparative Example 5 | ⊚ | X |

As clear in Table 6, when the thermosetting resin compositions obtained from the present invention were each applied with the adhesion enhancing film-forming composition, high adhesion was obtained even under exposure to a high temperature and high humidity environment. On the other hand, in Comparative Examples 4 and 5, the adhesion was decreased due to exposure to a high temperature and high humidity environment.

Evaluation of Electrical Insulation Properties

Example 12

The adhesion enhancing film-forming composition in Example 8 was applied to a silicon wafer having low electric resistance using a spin coater and baked at 140° C. for 1 minute to form an adhesion film. The resin solution in Example 7 was applied to the adhesion film using a spin coater and baked at 180° C. for 60 minutes to form a resin film.

Example 13

The adhesion enhancing film-forming composition in Example 9 was applied to a silicon wafer having low electric resistance using a spin coater and baked at 140° C. for 1 minute to form an adhesion film. The resin solution in Example 7 was applied to the adhesion film using a spin coater and baked at 180° C. for 60 minutes to form a resin film.

For the electrical insulation properties of the resin films obtained in Examples 12 and 13, a leakage current density (A/cm$^2$) at which an electric field intensity of 1 MV/cm, 3 MV/cm, and 5 MV/cm was applied through a mercury probe (CVmap92-A manufactured by Four Dimensions, Inc.) was measured. A leakage current density of less than 1×10$^{-8}$ was determined as ⊚, a leakage current density of 1×10$^{-8}$ or more and less than 1×10$^{-7}$ was determined as ○, and a leakage current density of 1×10$^{-7}$ or more was determined as x. The results are shown in Table 7.

TABLE 7

Electric insulation properties

|  | 1 MV/cm | 3 MV/cm | 5 MV/cm |
|---|---|---|---|
| Example 12 | ⊚ | ⊚ | ⊚ |
| Example 13 | ⊚ | ⊚ | ⊚ |

As shown in Table 7, even when an adhesion enhancing film was formed, thermosetting resin compositions obtained from the present invention, exhibited excellent insulation properties.

INDUSTRIAL APPLICABILITY

From the film-forming composition used in the present invention, a film that covers a substrate and achieves good electric insulation properties, heat resistance, and solvent resistance by heating at low temperature is obtained.

The invention claimed is:
1. A film-forming composition including:
a polymer (A) containing a unit structure of Formula (1):

Formula (1)

wherein
T$^1$ is an arylene group or a combination of an arylene group with T$^0$,
T$^0$ is an alkylene group, a fluorinated alkylene group, a carbonyl group, a sulfonyl group, or a combination thereof,
R$^1$ is a carboxyl group, an amino group, or an imino group, and
n1 is an integer of 1 to 6; and
a compound (B) having at least two isocyanate groups or blocked isocyanate groups.
2. The film-forming composition according to claim 1, wherein the polymer (A) is a polymer containing a unit structure of Formula (1) or a structure (A-1) having a combination of the unit structure of Formula (1) with a unit structure of Formula (2):

Formula (1)

Formula (2)

in Formula (1):
T$^1$ is an arylene group or a combination of an arylene group with T$^0$,
T$^0$ is an alkylene group, a fluorinated alkylene group, a carbonyl group, a sulfonyl group, or a combination thereof,
R$^1$ is a carboxyl group, an amino group, or an imino group, and
n1 is an integer of 1 to 6; and
in Formula (2):
T$^2$ is an arylene group or a combination of an arylene group with T$^0$, and
T$^0$ is an alkylene group, a fluorinated alkylene group, a carbonyl group, a sulfonyl group, or a combination thereof.
3. The film-forming composition according to claim 1, wherein the polymer (A) is a copolymer containing:
the structure (A-1) having a combination of the unit structure of Formula (1) with a unit structure of Formula (2)

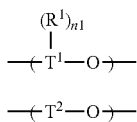
Formula (1)

Formula (2)

in Formula (1):
- $T^1$ is an arylene group or a combination of an arylene group with $T^0$,
- $T^0$ is an alkylene group, a fluorinated alkylene group, a carbonyl group, a sulfonyl group, or a combination thereof,
- $R^1$ is a carboxyl group, an amino group, or an imino group, and n1 is an integer of 1 to 6; and in Formula (2):
- $T^2$ is an arylene group or a combination of an arylene group with $T^0$, and
- $T^0$ is an alkylene group, a fluorinated alkylene group, a carbonyl group, a sulfonyl group, or a combination thereof; and
- a structure (A-2), where the structure (A-2) is a unit structure of Formula (3) or a combination of the unit structure of Formula (3) with a unit structure of Formula (4):

 Formula (3)

 Formula (4)

in Formulae (3) and (4):
- $T^3$ and $T^4$ are each an arylene group or a combination of an arylene group with $T^0$, and
- $T^0$ is an alkylene group, a fluorinated alkylene group, a carbonyl group, a sulfonyl group, or a combination thereof.

4. The film-forming composition according to claim 3, wherein $T^1$, $T^2$, $T^3$, and $T^4$ in Formulae (1) to (4) are each an organic group selected from the group consisting of the following Formulae (t-1) to (t-7):

—Ar¹— Formula (t-1)

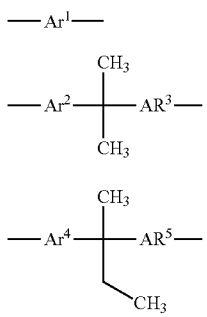

Formula (t-2)

Formula (t-3)

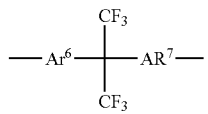 Formula (t-4)

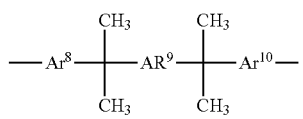 Formula (t-5)

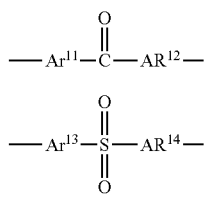 Formula (t-6)

Formula (t-7)

in Formulae (t-1) to (t-7): $Ar^1$ to $Ar^{14}$ are each a benzene ring, a naphthalene ring, or a fluorene ring.

5. The film-forming composition according to claim 3, wherein the polymer (A) contains the structures (A-1) and (A-2) at a ratio by mole of the structure (A-1) to the structure (A-2) of 10:90 to 40:60.

6. The film-forming composition according to claim 1, wherein the polymer (A) has a weight average molecular weight of 500 to 5,000,000.

7. The film-forming composition according to claim 1, wherein the isocyanate groups or the blocked isocyanate groups in the compound (B) having at least two isocyanate groups or blocked isocyanate groups is contained at a ratio of 0.5 mol to 1.5 mol relative to 1 mol of the carboxyl group, the amino group, or the imino group in the polymer (A).

8. The film-forming composition according to claim 1, further comprising a solvent.

9. An insulating film formed of a cured film of the film-forming composition according to claim 1.

10. A method for producing an insulating film comprising:
- applying an adhesion enhancing film-forming composition comprising a polysiloxane to a substrate,
- curing the adhesion enhancing film-forming composition that has been applied to the substrate to form an adhesion enhancing film,
- applying the film-forming composition according to claim 1 to the adhesion enhancing film, and
- curing the film-forming composition that has been applied to the adhesion enhancing film.

11. The insulating film according to claim 9 used as a film of covering a polished face of a thinned wafer.

12. The insulating film according to claim 9 used as a film of protecting a circuit face of a thinned wafer on which a circuit is formed.

* * * * *